(12) United States Patent
Warren et al.

(10) Patent No.: US 9,230,928 B2
(45) Date of Patent: Jan. 5, 2016

(54) SPOT PLATED LEADFRAME AND IC BOND PAD VIA ARRAY DESIGN FOR COPPER WIRE

(75) Inventors: Robert W. Warren, Newport Beach, CA (US); Nic Rossi, Causeway Bay (HK)

(73) Assignee: CONEXANT SYSTEMS, INC., Newport Beach, CA (US)

( * ) Notice: Subject to any disclaimer, the term of this patent is extended or adjusted under 35 U.S.C. 154(b) by 486 days.

(21) Appl. No.: 13/230,633

(22) Filed: Sep. 12, 2011

(65) Prior Publication Data

US 2013/0062742 A1    Mar. 14, 2013

(51) Int. Cl.
  *H01L 29/72*  (2006.01)
  *H01L 23/00*  (2006.01)
  *H01L 23/495* (2006.01)

(52) U.S. Cl.
  CPC .......... *H01L 24/05* (2013.01); *H01L 23/49582* (2013.01); *H01L 24/48* (2013.01); *H01L 24/29* (2013.01); *H01L 24/45* (2013.01); *H01L 2224/04042* (2013.01); *H01L 2224/05093* (2013.01); *H01L 2224/05095* (2013.01); *H01L 2224/293* (2013.01); *H01L 2224/2919* (2013.01); *H01L 2224/2929* (2013.01); *H01L 2224/29099* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/48599* (2013.01); *H01L 2224/48799* (2013.01); *H01L 2224/73265* (2013.01); *H01L 2224/85439* (2013.01); *H01L 2924/00014* (2013.01); *H01L 2924/00015* (2013.01); *H01L 2924/01014* (2013.01); *H01L 2924/01028* (2013.01); *H01L 2924/01029* (2013.01); *H01L 2924/01047* (2013.01); *H01L 2924/0665* (2013.01); *H01L 2924/0781* (2013.01); *H01L 2924/07802* (2013.01); *H01L 2924/10253* (2013.01); *H01L 2924/15747* (2013.01); *H01L 2924/30107* (2013.01); *H01L 2924/37001* (2013.01); *H01L 2924/37002* (2013.01)

(58) Field of Classification Search
  CPC ............................................ H01L 2224/48247
  USPC .......................... 257/666, E21.158, E23.054
  See application file for complete search history.

(56) References Cited

U.S. PATENT DOCUMENTS 5,710,456 A * 1/1998 Abbott et al. ................. 257/666
2003/0146497 A1    8/2003 Abbott
(Continued)

FOREIGN PATENT DOCUMENTS

DE   195 31 691     8/1996
JP   63-69241       3/1988
JP   2007-242644    9/2007

*Primary Examiner* — Edward Wojciechowicz
(74) *Attorney, Agent, or Firm* — Haynes and Boone, LLP

(57) ABSTRACT

There is provided a system and method for a spot plated leadframe and an IC bond pad via array design for copper wire. There is provided a semiconductor package comprising a leadframe having a pre-plated finish and a spot plating on said pre-plated finish, a semiconductor die including a bond pad on a top surface thereof, and a copper wire bonded to said spot plating and to said bond pad. Optionally, a novel corner via array design may be provided under the bond pad for improved package performance while maintaining the integrity of the copper wire bond. The semiconductor package may provide several advantages including high MSL ratings, simplified assembly cycles, avoidance of tin whisker issues, and low cost compared to conventional packages using gold wire bonds.

9 Claims, 4 Drawing Sheets

(56) References Cited

U.S. PATENT DOCUMENTS

| | | | |
|---|---|---|---|
| 2003/0164553 A1* | 9/2003 | Cheng et al. ................. 257/783 |
| 2011/0079887 A1 | 4/2011 | Shim |
| 2011/0111562 A1* | 5/2011 | San Antonio et al. ........ 438/113 |
| 2012/0034742 A1* | 2/2012 | Muto et al. ................... 438/123 |

\* cited by examiner

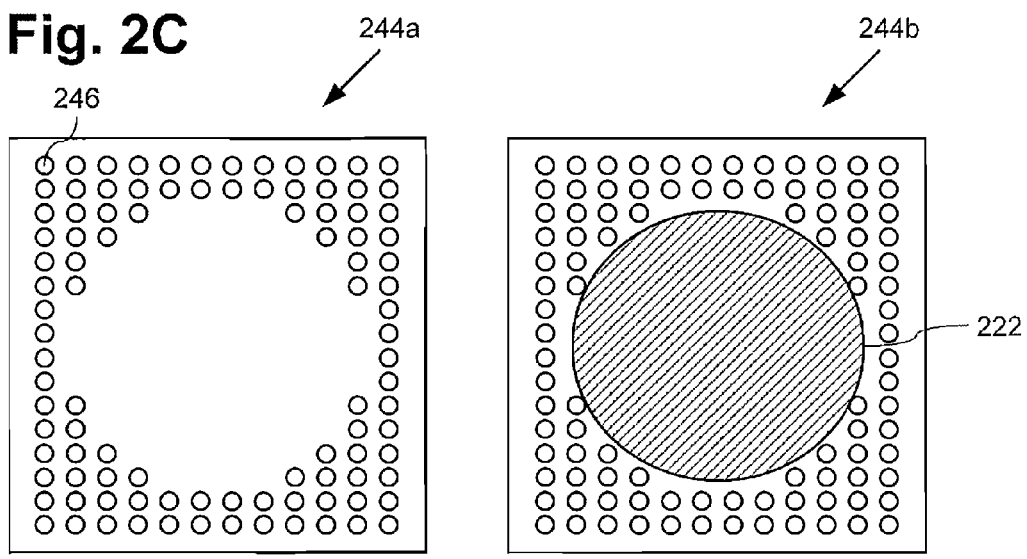

SPOT PLATED LEADFRAME AND IC BOND PAD VIA ARRAY DESIGN FOR COPPER WIRE

BACKGROUND OF THE INVENTION

1. Field of the Invention

The present invention relates generally to semiconductor devices. More particularly, the present invention relates to copper wire bonding for semiconductor devices.

2. Background Art

Conventionally, gold has been the material of choice for wire bonding, as gold is soft enough to bond readily to most integrated circuit (IC) pad surfaces while providing sufficient conductivity. Thus, IC pad surfaces have generally evolved in design to support gold wire bonds. However, with steadily increasing material costs for gold and ever increasing requirements for improved electrical and thermal performance, industry demands for suitable alternative materials are becoming increasingly urgent.

One particularly promising material is copper, which provides similar self-inductance and self-capacitance properties as gold while reducing electrical resistance and improving thermal conductivity. Additionally, the material cost of copper is much less compared to gold. However, due to the increased hardness of copper compared to gold, it is often difficult to provide a secure and reliable copper wire bond connection to IC pad surfaces that are generally designed for gold wire bonds. More specifically, the harder and less pliable copper wire ball bond on the IC pad surface creates issues such as first bond pad metal cracking or peeling and silicon or dielectric cratering and cracking. While IC wafers may be plated with electro-less Ni/Pd/Au for a thicker and more robust metal pad structure suitable for copper wire bonding, such a procedure may be impractical due to cost and limited availability of qualified sources.

Copper wire also presents technical challenges in applications where via arrays are desirable under a bond pad, for example to improve thermal and/or electrical conduction. The use of conventional grid via array designs with vias densely grouped under the copper wire bond at the bond pad creates stress risers. To avoid this issue, it is known to use a perimeter via array design by placing vias only at the perimeter of the metal pad under the passivation. However, the low via density of the perimeter via array compared to the grid via array results in higher resistance and significantly lower performance.

Furthermore, to provide advantages such as higher moisture sensitivity level (MSL) ratings and simplified package assembly cycles, it may be desirable to use leadframes with pre-plated finishes such as Ni/Pd/Au instead of conventional copper leadframes with Ag plating, which cannot reach high MSL ratings and further require a separate plating step. However, since copper wire does not readily bond to such pre-plated leadframes, it may prove difficult to connect ICs to the leadframe using copper wire.

Accordingly, there is a need to overcome the drawbacks and deficiencies in the art by providing a simple, cost effective, and reliable way to connect copper wire to IC bond pads and pre-plated lead frames.

SUMMARY OF THE INVENTION

There are provided systems and methods for a spot plated leadframe and an IC bond pad via array design for copper wire, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein:

FIG. 2C presents a top view of a bond pad with a corner via array, according to an embodiment of the present invention;

DETAILED DESCRIPTION OF THE INVENTION

The present application is directed to a system and method for a spot plated leadframe and an IC bond pad via array design for copper wire. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art. The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. Additionally, for reasons of clarity, the drawings may not be to scale.

Figure 1A:
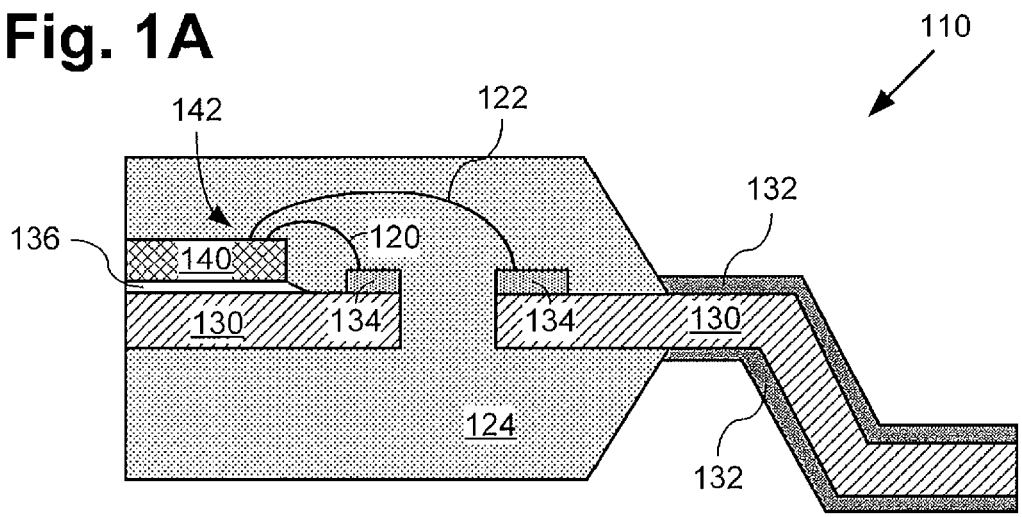
FIG. 1A presents a cross sectional view of a conventional package having a leadframe with plating.

FIG. 1A presents a cross sectional view of a conventional package having a leadframe with plating. Package 110 of FIG. 1A includes copper wire 120 and 122, mold compound 124, leadframe 130, leadframe plating 132, wire bondable plating 134, die attach material 136, and IC 140. IC 140 includes a bond pad 142 on a top surface thereof, which receives the copper wire 122.

Leadframe 130 may comprise, for example, a copper or copper alloy. Since leadframe 130 is not a pre-plated leadframe, wire bondable plating 134, which may comprise wire bondable materials such as silver or a silver alloy, is spot plated on leadframe 130 as shown in FIG. 1A. IC 140 may then be attached to leadframe 130 by die attach material 136, which may comprise, for example, a conductive or non-conductive epoxy. IC 140 may comprise any semiconductor die such as a control device, a power transistor, a logic chip, or another device. Copper wire 122 may then be connected to bond pad 142 on the top surface of IC 140, and also connected to wire bondable plating 134 on leadframe 130. Optionally, a copper wire 120 may connect IC 140 to wire bondable plating 134 on the die paddle portion of leadframe 130. A grid of vias may also be optionally provided underneath bond pad 140 for thermal and/or electrical conductivity. After all the connections are made, mold compound 124 may encapsulate package 110. Leadframe plating 132, which may comprise a tin or tin alloy, is then plated on leadframe 130.

While package 110 of FIG. 1A allows for the use of copper wire 120 and 122, the requirement of a separate plating step to apply leadframe plating 132 results in longer assembly cycle times, tin whisker growth issues, and reduced moisture sensitivity level (MSL) ratings. For example, package 110 may be limited to a maximum MSL 3 rating, reducing the shelf life of package 110.

Figure 1B:
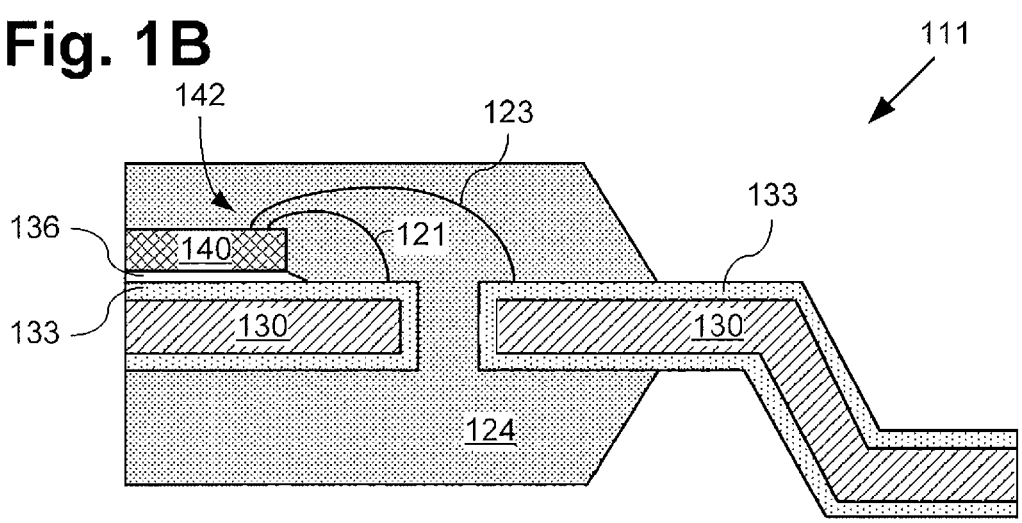
FIG. 1B presents a cross sectional view of a package having a pre-plated leadframe.

Accordingly, moving to FIG. 1B, FIG. 1B presents a cross sectional view of a conventional package having a pre-plated leadframe. With regards to FIG. 1B, like numbered elements may correspond to similar elements from FIG. 1A. Leadframe 130 of package 111 may already have a pre-plated finish 133, which may include, but is not limited to, a Ni/Pd/Au finish. Accordingly, the wire bondable plating 134 from FIG. 1A may be omitted, and the gold wire 121 and 123 may be directly connected to pre-plated finish 133. Additionally, the separate step of applying leadframe plating 132 to leadframe 130 may be omitted, removing concerns regarding tin whiskers.

However, because the surface of pre-plated finish 133 is already hard, it is difficult to securely bond a copper wire directly to pre-plated finish 133 with high manufacturing yields and high reliability. Thus, the softer gold wire 121 and 123 must be utilized instead of the harder copper wire 120 and 122. Accordingly, while the package 111 may provide the advantages of a pre-plated leadframe, such as increased MSL ratings up to MSL 1, simplified assembly cycles without a plating step, and avoidance of tin whisker issues, the requirement to use gold wire 121 and 123 for leadframe connections undesirably increases the cost of package 111.

Figure 1C:
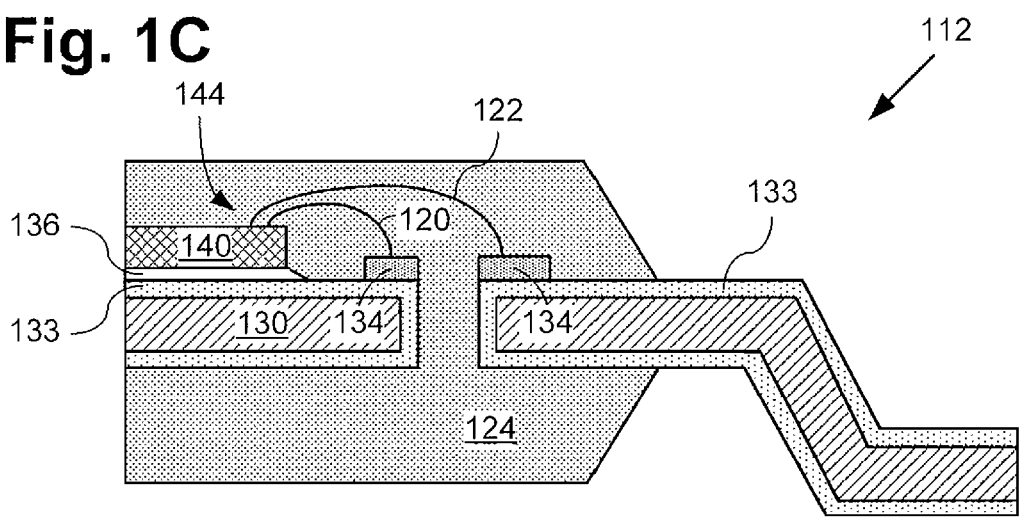
FIG. 1C presents a cross sectional view of a package having a pre-plated leadframe connected to an integrated circuit (IC) by copper wire, according to an embodiment of the present invention.

Turning therefore to FIG. 1C, FIG. 1C presents a cross sectional view of a package having a pre-plated leadframe connected to an integrated circuit (IC) by copper wire, according to an embodiment of the present invention. With regards to FIG. 1C, like numbered elements may correspond to similar elements from FIGS. 1A and 1B. As with FIG. 1B, a pre-plated leadframe 130 is utilized. However, the top of pre-plated finish 133 may be additionally spot plated with wire bondable plating 134, as shown in FIG. 1C. Thus, copper wire 122 may be connected to wire bondable plating 134, and to bond pad 144 on a top surface of IC 140. Optionally, copper wire 120 may also connect IC 140 to wire bondable plating 134 on the die paddle of leadframe 130. Accordingly, package 112 of FIG. 1C provides the advantages of a pre-plated leadframe, as described above in conjunction with package 111, but while using low cost, high conductivity copper wire, as with conventional package 110. Thus, high cost gold wire may not be present in package 112. Vias using a novel corner array design may also be optionally provided under bond pad 144, as described below in conjunction with FIGS. 2A and 2B.

Figure 2A:
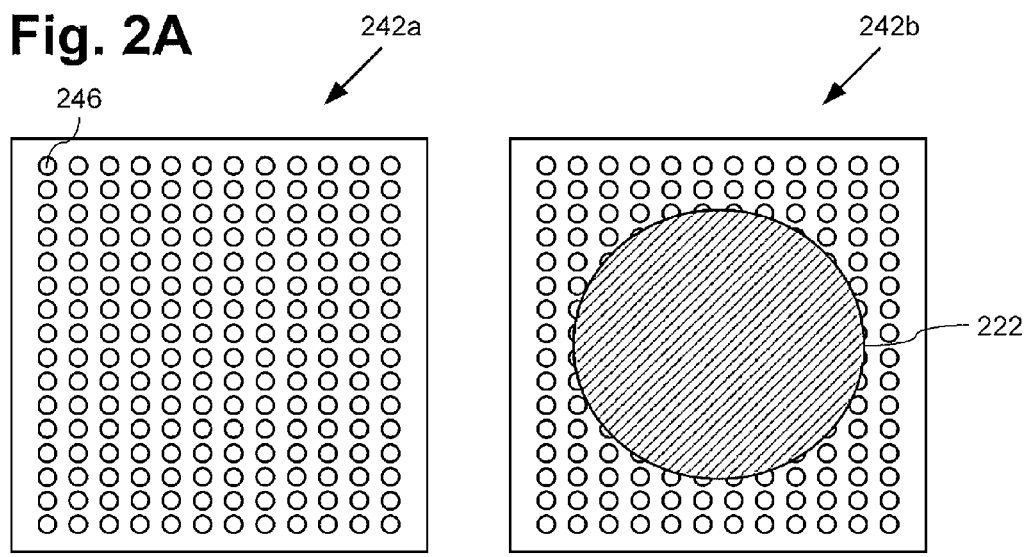
FIG. 2A presents a top view of a bond pad with a conventional grid via array.

FIG. 2A presents a top view of a bond pad with a conventional grid via array. With respect to FIG. 2A, bond pad 242a may correspond to bond pad 142 from FIGS. 1A and 1B. A conventional grid via array is provided for bond pad 242a, including a representative via 246, as identified. Bond pad 242b illustrates bond pad 242a after connecting a wire bond 222, for example by a ball or wedge bond. However, as shown by bond pad 242b, wherein wire bond 222 is shown partially transparent for clarity, several vias are densely grouped under wire bond 222, reducing the integrity of the bond pad and promoting the formation of stress risers, particularly if wire bond 222 comprises a copper wire bond.

Figure 2B:
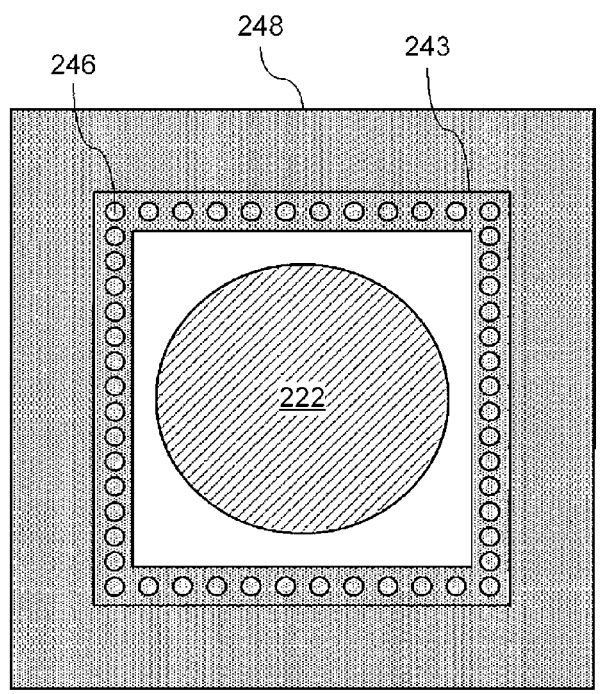
FIG. 2B presents a top view of a bond pad with a perimeter via array.

Moving to FIG. 2B, FIG. 2B presents a top view of a bond pad with a perimeter via array. As shown in FIG. 213, the perimeter edges of bond pad 243 are covered by a passivation layer 248, of which only a portion may be shown. Vias are placed around the perimeter of bond pad 243 under the passivation layer 248, including a representative via 246. Thus, a portion of bond pad 243 not covered by passivation layer 248, or the opening of bond pad 243, is completely free of vias. Accordingly, wire bond 222 may be connected to bond pad 243 without causing stress risers, in contrast to the grid via array of FIG. 2A. However, it can be observed that the density of vias under bond pad 243 is significantly less than the density of vias under bond pad 242b in FIG. 2A. Thus, the low thermal and electrical conductivity of the perimeter via array shown in FIG. 2B may provide insufficient performance for practical use.

Accordingly, FIG. 2C presents a top view of a bond pad with a corner via array, according to an embodiment of the present invention. With respect to FIG. 2C, bond pad 244a may correspond to bond pad 144 from FIG. 1C. As shown by bond pad 244a, a pattern of vias, including a representative via 246, is arranged below bond pad 244a such that the corners have a high density of vias, whereas the central area of the bond pad where an anticipated wire bond will be received has a low density of vias. The specific pattern of vias on bond pad 244a may be adjusted based on the known tolerances of the fabrication equipment to be utilized. Thus, when a bond wire 222 is connected to bond pad 244a to result in bond pad 244b, the area below bond wire 222 may be largely free of vias underneath. Although bond pad 244b shows no vias under wire bond 222, alternative embodiments may include some vias under bond wire 222 for improved performance, for example by adding vias in specific areas where wire bond 222 may exert comparatively less pressure. Thus, a corner via array may be provided, avoiding the promotion of stress risers as with conventional grid arrays while achieving improved performance through a via density 30-50% or greater compared to a perimeter via array.

Figure 3:
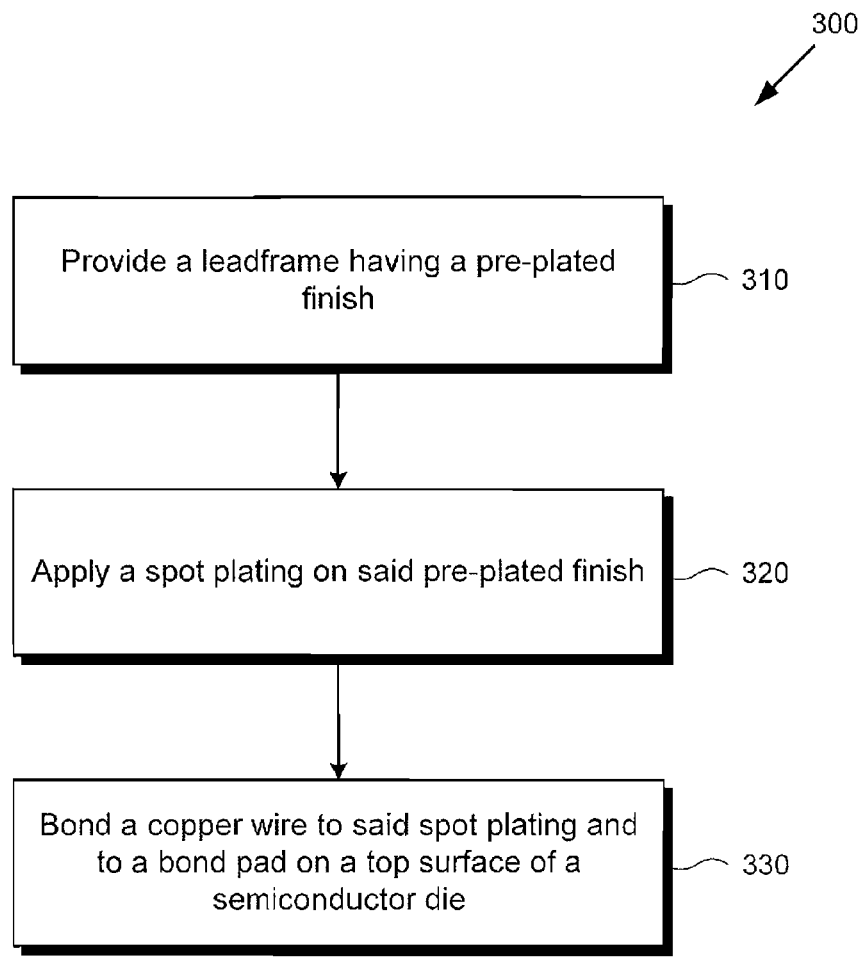
FIG. 3 shows a flowchart describing the steps, according to one embodiment of the present invention, by which a semiconductor package supporting copper wire may be provided.

Moving to FIG. 3, FIG. 3 shows a flowchart describing the steps, according to one embodiment of the present invention, by which a semiconductor package supporting copper wire may be provided. Certain details and features have been left out of flowchart 300 that are apparent to a person of ordinary skill in the art. For example, a step may comprise one or more substeps or may involve specialized equipment or materials, as known in the art. While steps 310 through 330 indicated in flowchart 300 are sufficient to describe one embodiment of the present invention, other embodiments of the invention may utilize steps different from those shown in flowchart 300.

Referring to step 310 of flowchart 300 in FIG. 3 and package 112 of FIG. 1C, step 310 of flowchart 300 comprises providing leadframe 130 having a pre-plated finish 133. Thus, as shown in FIG. 1C, the leadframe 130 is already formed, shaped, and finished with pre-plated finish 133 prior to usage in an assembly cycle. This is in contrast to leadframe plating 132 in conventional package 110 of FIG. 1A, which must be applied in a separate post assembly step.

Referring to step 320 of flowchart 300 in FIG. 3 and package 112 of FIG. 1C, step 320 of flowchart 300 comprises applying a spot plating of wire bondable plating 134 on pre-plated finish 133. The wire bondable plating 134 only needs to be applied where a wire bond is to be received on the leadframe. Thus, as shown in FIG. 1C, wire bondable plating 134 is spot applied where copper wire 122 is received on leadframe 130. Optionally, to provide a connection to the die paddle, a spot plating may also be applied where copper wire 120 is received on leadframe 130.

Referring to step 330 of flowchart 300 in FIG. 3 and package 112 of FIG. 1C, step 330 of flowchart 300 comprises bonding copper wire 122 to wire bondable plating 134 and to bond pad 144 on a top surface of semiconductor die 140. Since the spot plating of wire bondable plating 134 is provided, the copper wire 122 may easily bond to the plated surface. Furthermore, as shown by bond pad 244b of FIG. 2C, a corner via array may be provided under bond pad 144 to provide thermal and/or electrical conduction while maintaining the integrity of the copper wire 122 connection at bond pad 144. Thus, performance may be improved while maintaining package reliability and manufacturability.

Thus, a method for providing a semiconductor package supporting copper wire has been disclosed. By utilizing pre-plated leadframes with spot plating for copper wire bonding, the disclosed semiconductor package may provide MSL ratings up to MSL 1, simplified assembly cycles without a plating step, and avoidance of tin whisker issues while using cost effective, high conductivity copper wire. Furthermore, by utilizing a novel corner via array design below semiconductor die bond pads of the package, package performance may be improved while maintaining copper wire bond integrity for improved reliability and manufacturability.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A semiconductor package comprising:
    a leadframe having a pre-plated finish and a spot plating on said pre-plated finish;
    a semiconductor die including a bond pad on a top surface thereof; and
    a copper wire bonded to said spot plating and to said bond pad, wherein a plurality of vias are arranged in a corner array pattern under said bond pad such that a central area under a portion of said bond pad for receiving said copper wire has a low density of vias, and remaining perimeter and non-perimeter areas under said bond pad have a high density of vias.

2. The semiconductor package of claim 1, wherein said pre-plated finish is a Ni/Pd/Au finish.

3. The semiconductor package of claim 1, wherein said spot plating comprises silver.

4. The semiconductor package of claim 1, wherein said leadframe comprises copper.

5. The semiconductor package of claim 1, wherein gold wire bonds are not present.

6. The semiconductor package of claim 1, wherein said semiconductor package achieves a moisture sensitivity level (MSL) rating of MSL 1.

7. The semiconductor package of claim 1, wherein said leadframe does not include a tin plating.

8. The semiconductor package of claim 1, wherein said semiconductor die and said spot plating are situated on said pre-plated finish on said leadframe, and
    wherein the leadframe further comprises a die paddle portion, and a second spot plating, wherein said second spot plating is situated on a pre-plated finish of said die paddle portion.

9. The semiconductor package of claim 8, wherein another copper wire is bonded to said semiconductor die and to said second spot plating.

\* \* \* \* \*